(12) United States Patent
Lin et al.

(10) Patent No.: US 7,762,316 B2
(45) Date of Patent: Jul. 27, 2010

(54) HEAT-DISSIPATING DEVICE WITH HIGH HEAT-DISSIPATING EFFICIENCY

(75) Inventors: Hao-Hui Lin, Taitung (TW); Su-Chen Hu, Tainan (TW)

(73) Assignee: Man Zai Industrial Co., Ltd., Tainan, Taw (TW)

( * ) Notice: Subject to any disclaimer, the term of this patent is extended or adjusted under 35 U.S.C. 154(b) by 403 days.

(21) Appl. No.: 11/834,501

(22) Filed: Aug. 6, 2007

(65) Prior Publication Data
US 2009/0040723 A1 Feb. 12, 2009

(51) Int. Cl.
*F28F 7/00* (2006.01)
*H05K 7/20* (2006.01)

(52) U.S. Cl. .................. 165/80.4; 165/104.33
(58) Field of Classification Search ........... 165/80.4, 165/185, 80.3, 104.33; 361/699, 702, 704; 257/714
See application file for complete search history.

(56) References Cited

U.S. PATENT DOCUMENTS

| | | | | |
|---|---|---|---|---|
| 4,188,996 A | * | 2/1980 | Pellant et al. | 165/80.4 |
| 4,714,107 A | * | 12/1987 | Adsett | 165/166 |
| 5,925,929 A | * | 7/1999 | Kuwahara et al. | 257/714 |
| 6,702,002 B2 | * | 3/2004 | Wang | 165/80.3 |
| 2005/0128705 A1 | * | 6/2005 | Chu et al. | 361/699 |
| 2005/0263265 A1 | * | 12/2005 | Sheng et al. | 165/104.21 |
| 2007/0012423 A1 | * | 1/2007 | Kinoshita et al. | 165/80.4 |
| 2007/0039716 A1 | * | 2/2007 | Yeh et al. | 165/80.4 |
| 2008/0029260 A1 | * | 2/2008 | Hu et al. | 165/182 |

* cited by examiner

*Primary Examiner*—Tho v Duong
(74) *Attorney, Agent, or Firm*—Ladas & Parry, LLP (57) ABSTRACT

A heat-dissipating device includes a housing, a partitioning member, a finned structure, and a high thermal-conductivity strip. The housing defines an inner space, and has a top surface formed with a retaining groove, and an inlet and an outlet. The partitioning member is disposed in the inner space so as to divide the inner space into first and second compartments that are respectively connected to the inlet and the outlet. The finned structure includes a plurality of partitioning plates disposed in the first compartment so as to divide the first compartment into a plurality of partitioned sections that are connected to form a continuous meandering fluid path, and a plurality of heat-dissipating fins disposed in each of the partitioned sections. The conductive strip is secured in the retaining groove in the top surface of the housing and has a thermal conductivity higher than that of the housing.

6 Claims, 9 Drawing Sheets

HEAT-DISSIPATING DEVICE WITH HIGH HEAT-DISSIPATING EFFICIENCY

BACKGROUND OF THE INVENTION

1. Field of the Invention

This invention relates to a heat-dissipating device, more particularly to a heat-dissipating device that has a high heat-dissipating efficiency.

2. Description of the Related Art

Figure 1:
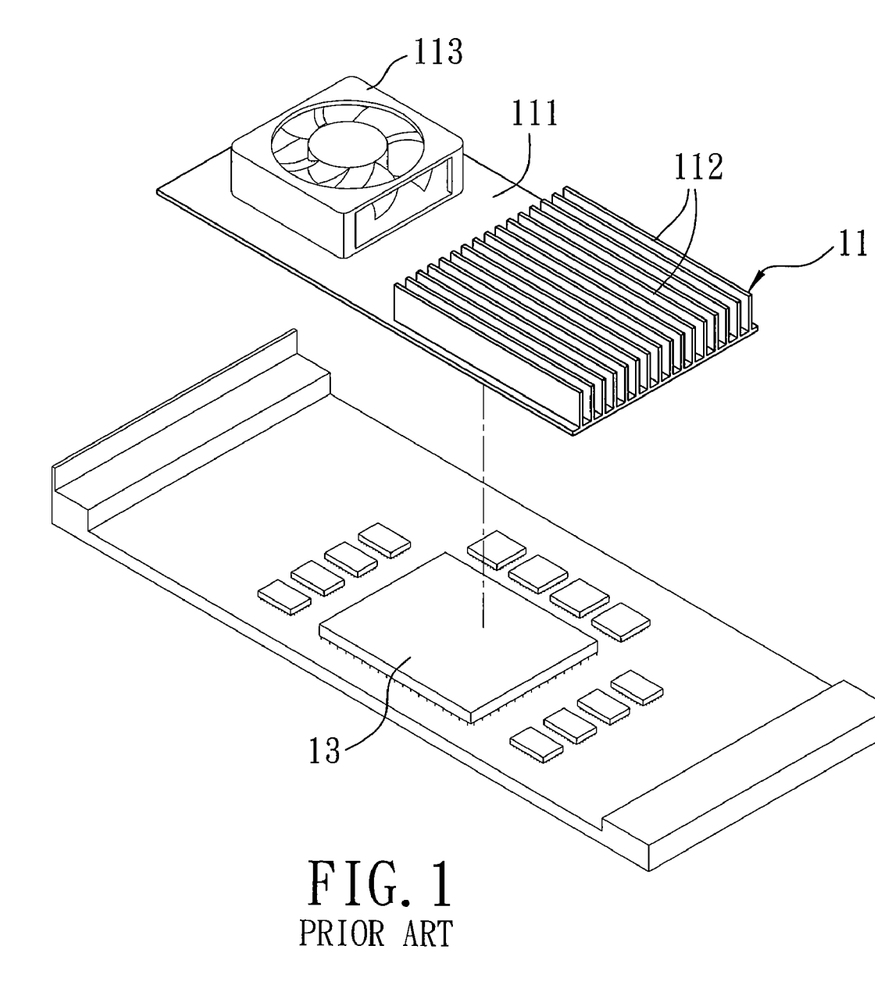
FIG. 1 is a schematic view of a conventional heat-dissipating device.

FIG. 1 illustrates a conventional heat-dissipating device 11 that includes a planar plate 111, a plurality of heat-dissipating fins 112, and a fan unit 113. The planar plate 111 has top and bottom surfaces. The heat-dissipating fins 112 are formed on a right end portion of the top surface of the planar plate 111. The fan unit 113 is mounted on a left end portion of the top surface of the planar plate 111.

Figure 2:
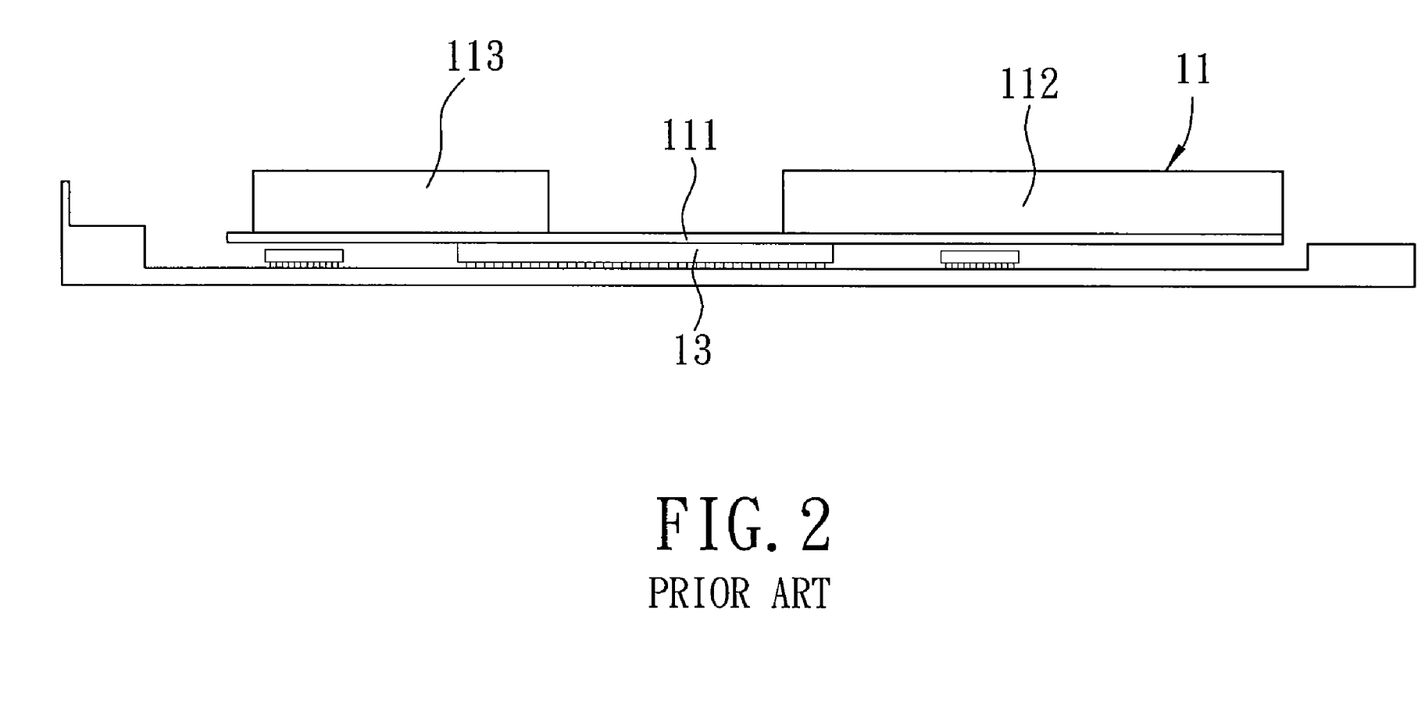
FIG. 2 is a schematic view of the conventional heat-dissipating device in a state of use.

During assembly, as illustrated in FIG. 2, the bottom surface of the planar plate 111 is first disposed on a heat source 13, such as a graphics processing unit (GPU) of a video graphics array (VGA) card. Thereafter, the fan unit 113 is connected to a power source.

During a cooling operation, heat generated by the heat source 13 is conducted through the planar plate 111 to the heat-dissipating fins 112, and, at the same time, the fan unit 113 generates airflow to cool the heat-dissipating fins 112, thereby removing the heat conducted by the heat-dissipating fins 112.

Although the aforementioned conventional heat-dissipating device 11 achieves its intended purpose, the conventional heat-dissipating device 11 has a low heat-dissipating efficiency.

SUMMARY OF THE INVENTION

Therefore, the object of the present invention is to provide a heat-dissipating device that has a high heat-dissipating efficiency.

According to the present invention, a heat-dissipating device comprises a housing, a partitioning member, a finned structure, and a high thermal-conductivity strip. The housing includes a planar plate and a cap-like cover. The planar plate has top and bottom surfaces. The top surface of the planar plate is formed with a retaining groove. The cap-like cover is secured to the bottom surface of the planar plate, cooperates with the planar plate to define an inner space therebetween, and has an inlet and an outlet. The partitioning member is disposed in the inner space so as to divide the inner space into first and second compartments. The second compartment is connected to and spatially communicated with the outlet. The finned structure includes a plurality of partitioning plates and a plurality of heat-dissipating fins. The partitioning plates are disposed in the first compartment so as to divide the first compartment into a plurality of partitioned sections that are connected to form a continuous meandering fluid path for permitting fluid communication between the first and second compartments. The meandering fluid path has a first end connected to and spatially communicated with the inlet, and a second end connected to and spatially communicated with the second compartment. The heat-dissipating fins are disposed in each of the partitioned sections. The high thermal-conductivity strip is secured in the retaining groove in the top surface of the planar plate and has a thermal conductivity higher than that of the planar plate.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 3:
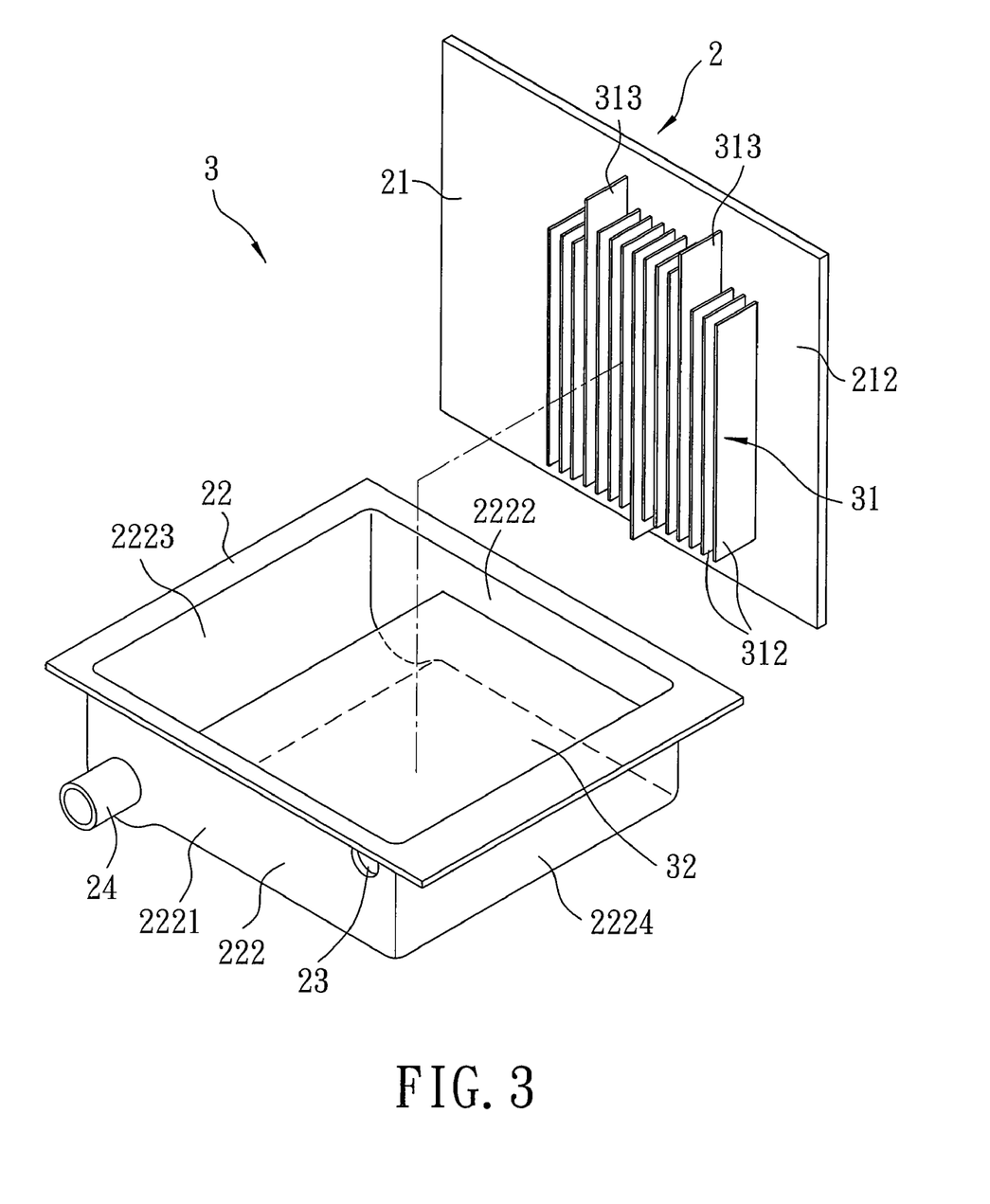
FIG. 3 is an exploded perspective view of the first preferred embodiment of a heat-dissipating device according to this invention.
Figure 4:
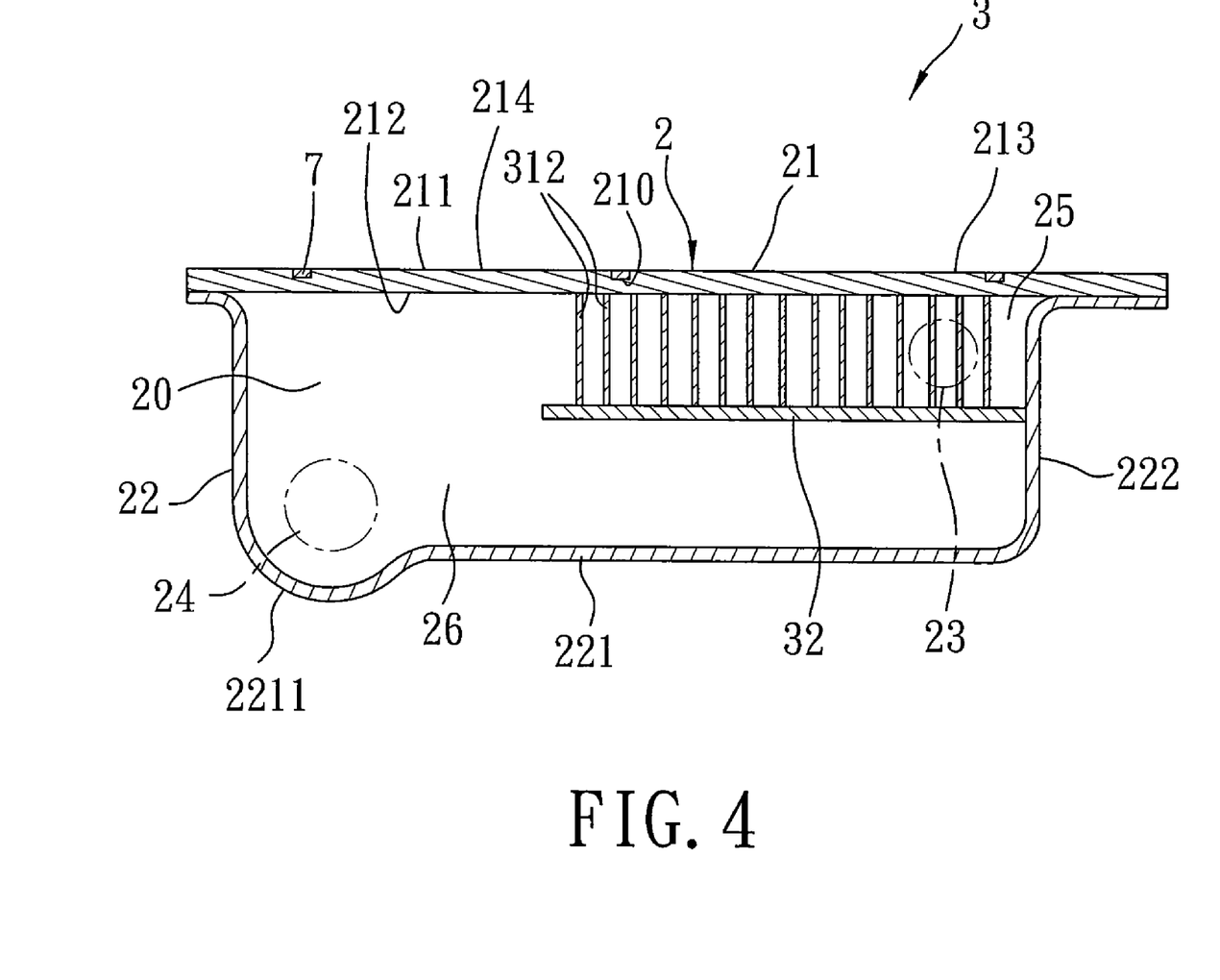
FIG. 4 is a schematic sectional view of the first preferred embodiment in an assembled state.

Referring to FIGS. 3 and 4, the first preferred embodiment of a heat-dissipating device 3 according to this invention is shown to include a first housing 2, a partitioning member 32, a first finned structure 31, and a high thermal-conductivity strip 7.

The first housing 2 includes a first planar plate 21 and a first cap-like cover 22. The first planar plate 21 has a high thermal conductivity, and top and bottom surfaces 211, 212. In this embodiment, the top surface 211 of the first planar plate 21 is formed with a retaining groove 210. The first cap-like cover 22 cooperates with the first planar plate 21 to define an inner space 20 therebetween. In particular, the first cap-like cover 22 includes a base wall 221 spaced apart from the first planar plate 21, and a surrounding wall 222 that extends transversely from the base wall 221 thereof, and that is secured to the bottom surface 212 of the first planar plate 21. In this embodiment, the surrounding wall 222 of the first cap-like cover 22 has front and rear wall portions 2221, 2222, and left and right wall portions 2223, 2224 that interconnect the front and rear wall portions 2221, 2222 thereof. The front wall portion 2221 of the surrounding wall 222 of the first cap-like cover 22 has an inlet 23 and an outlet 24.

It is noted herein that the base wall 221 of the first cap-like cover 22 has a convex portion 2211, while the remainder of the base wall 221 of the first cap-like cover 22 is flat. The outlet 24 is disposed adjacent to the convex portion 2211 of the base wall 221 of the first cap-like cover 22.

The partitioning member 32 is disposed in the inner space 20 so as to divide the inner space 20 into first and second compartments 25, 26. In particular, the partitioning member 32 extends parallel to the first planar plate 21, and is disposed between and spaced apart from the first planar plate 21 and the base wall 221 of the first cap-like cover 22. In this embodiment, the partitioning member 32 is generally rectangular in shape, and has front and rear ends, and left and right ends. The front and rear ends, and the right end of the partitioning member 32 are respectively connected to the front and rear wall portions 2221, 2222, and the right wall portion 2224 of the surrounding wall 222 of the first cap-like cover 22. The left end of the partitioning member 32 is spaced apart from the left wall portion 2223 of the surrounding wall 222 of the first cap-like cover 22.

The second compartment 26 is directly connected to and is spatially communicated with the outlet 24.

The first planar plate 21 has a first end portion 213 that cooperates with the partitioning member 32 and a portion of the surrounding wall 222 of the first cap-like cover 22 to define the first compartment 25, and a second end portion 214 that cooperates with the partitioning member 32, and the base wall 221, and the remainder of the surrounding wall 222 of the first cap-like cover 22 to define the second compartment 26. In this embodiment, the second compartment 26 is larger than the first compartment 25.

Figure 5:
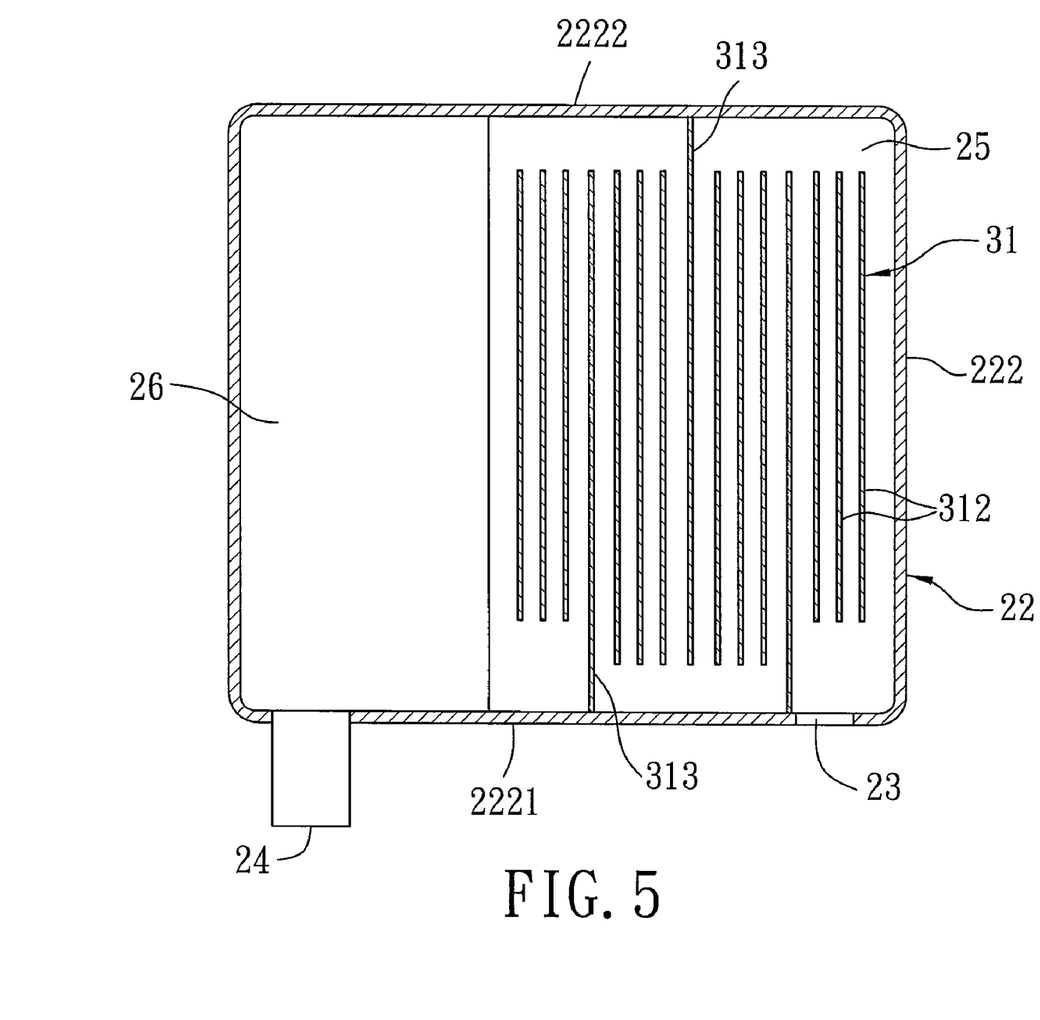
FIG. 5 is a schematic sectional view illustrating a finned structure of the first preferred embodiment.

With further reference to FIG. 5, the first finned structure 31 includes a plurality of partitioning plates 313 and a plurality of heat-dissipating fins 312.

The partitioning plates 313 are formed on the bottom surface 212 of the first planar plate 21, are disposed in the first compartment 25, and abut against the partitioning member 32 so as to divide the first compartment 25 into a plurality of partitioned sections that are connected to form a continuous meandering fluid path for permitting fluid communication between the first and second compartments 25, 26. The meandering fluid path has a first end directly connected to and spatially communicated with the inlet 23, and a second end directly connected to and spatially communicated with the second compartment 26. In this embodiment, each of the partitioning plates 313 extends between the front and rear wall portions 2221, 2222 of the surrounding wall 222 of the first cap-like cover 22.

The heat-dissipating fins 312 are formed on the bottom surface 212 of the first planar plate 21 and are disposed in each of the partitioned sections of the first compartment 25. In this embodiment, each of the heat-dissipating fins 312 extends between the front and rear wall portions 2221, 2222 of the surrounding wall 222 of the first cap-like cover 22.

The high thermal-conductivity strip 7 extends curvedly from the first end portion 213 to the second end portion 214 of the first planar plate 21, is secured in the retaining groove 210 in the top surface 211 of the first planar plate 21, and is flush with the top surface 211 of the first planar plate 21. In this embodiment, the high thermal-conductivity strip 7 has a thermal conductivity higher than that of the first planar plate 21.

During assembly, the top surface 211 of the first planar plate 21 is first disposed on a heat source (not shown), such as a graphics processing device (GPU) of a video graphics array (VGA) card. Then, the inlet 23 and the outlet 24 are connected to a pump (not shown) through a pipe (not shown).

During a cooling operation, heat generated by the heat source is conducted through the high thermal-conductivity strip 7 and the first planar plate 21 to the first finned structure 31. At the same time, the pump supplies a coolant (not shown) into the first compartment 25 through the inlet 23, and draws the coolant out of the second compartment 26 through the outlet 24. During this operation, the coolant passes through the meandering fluid path and cools the first finned structure 31, thereby permitting efficient dissipation of the heat conducted by the first finned structure 31.

Figure 6:
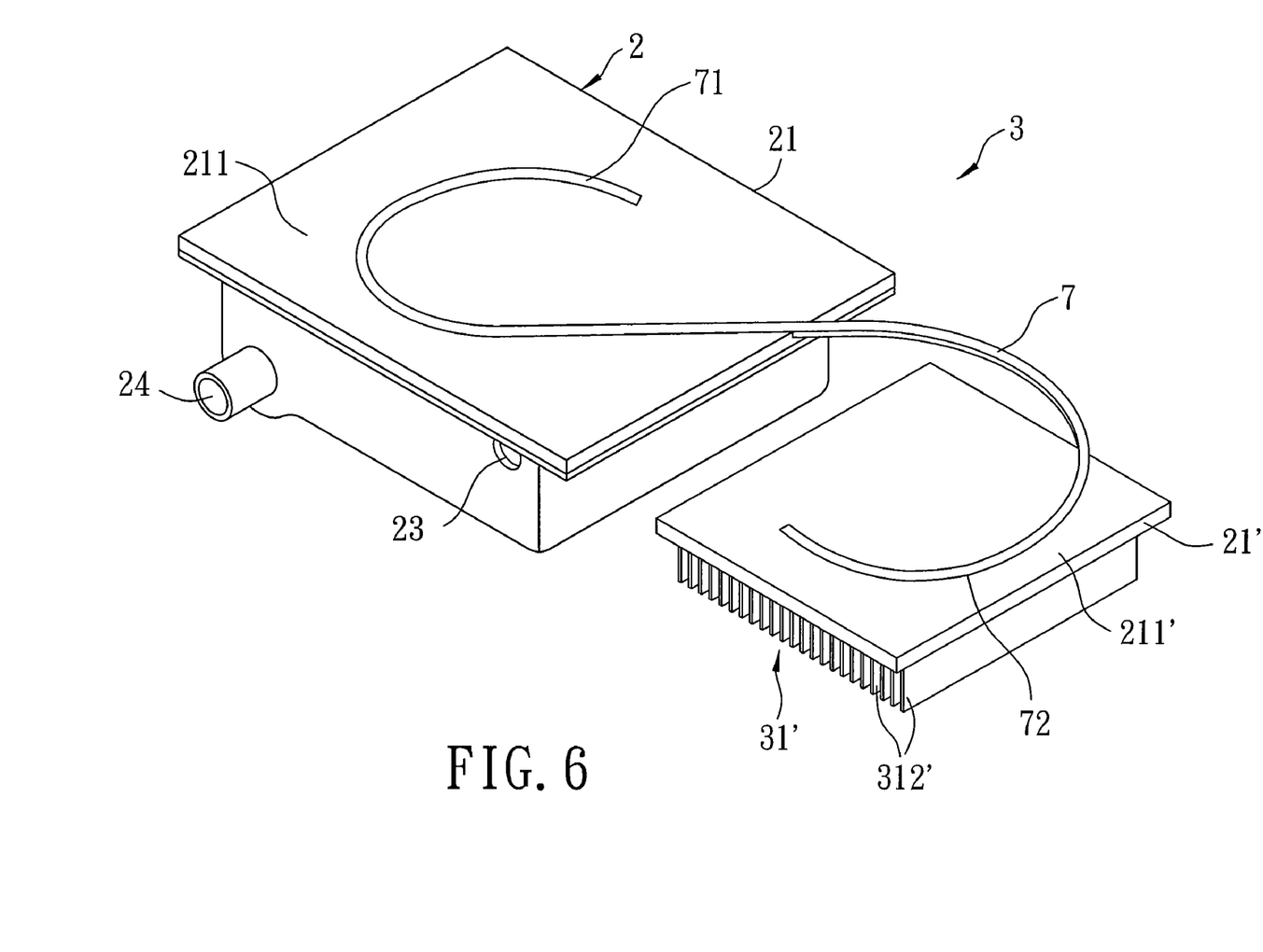
FIG. 6 is a perspective view of the second preferred embodiment of a heat-dissipating device according to this invention.
Figure 7:
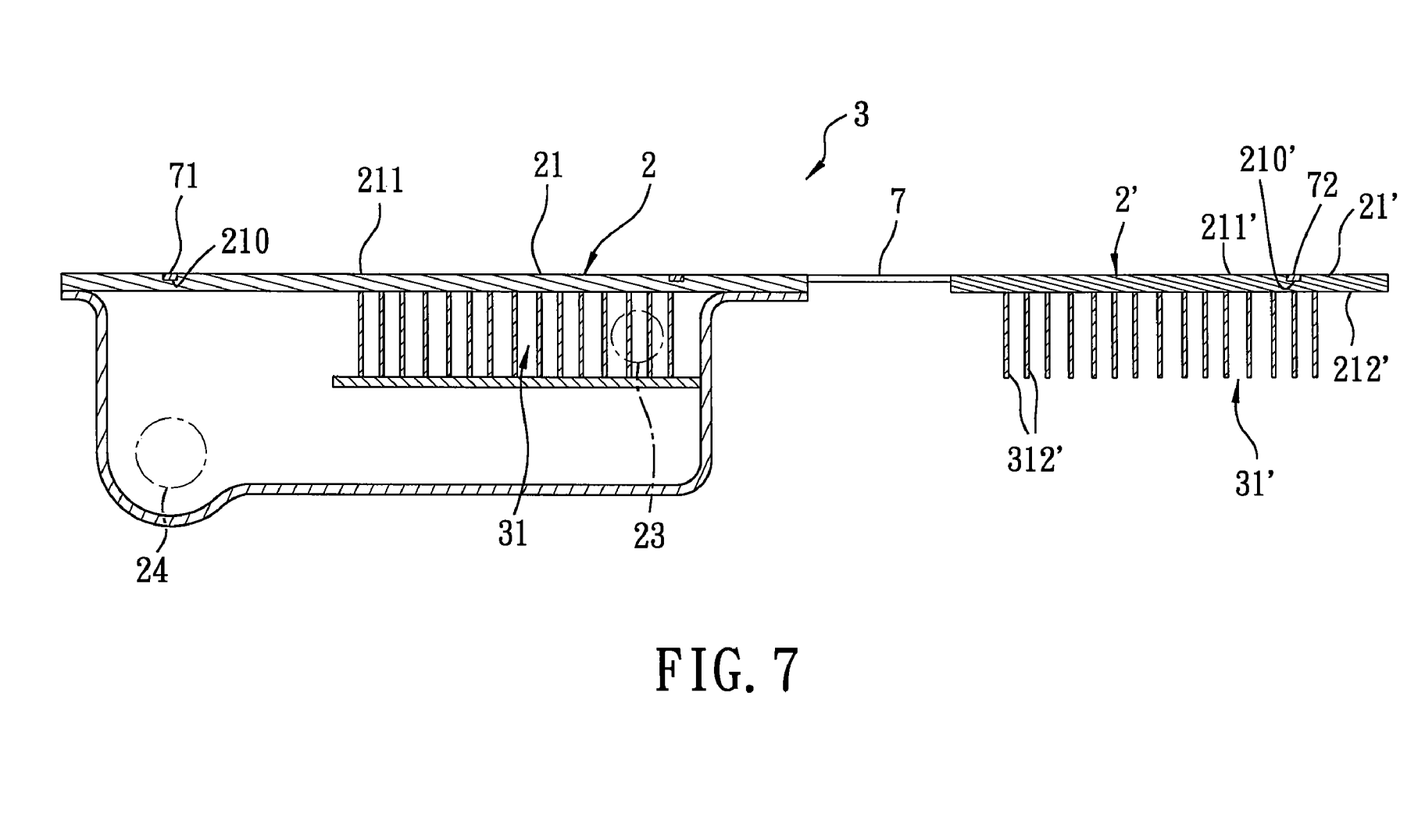
FIG. 7 is a schematic sectional view of the second preferred embodiment.

FIGS. 6 and 7 illustrate the second preferred embodiment of a heat-dissipating device 3 according to this invention. When compared to the previous embodiment, the heat-dissipating device 3 of this embodiment further includes a heat-dissipating unit 2' that is spaced apart from the first housing 2, and includes a second planar plate 21' and a second finned structure 31'. The second planar plate 21' has top and bottom surfaces 211', 212'. In this embodiment, the top surface 211' of the second planar plate 21' is formed with a retaining groove 210'. The second finned structure 31' includes a plurality of heat-dissipating fins 312' that are formed on the bottom surface 212' of the second planar plate 21'. The high thermal-conductivity strip 7 has a first curved segment 71 that is secured in the retaining groove 210 in the top surface 211 of the first planar plate 21 and that is flush with the top surface 211 of the first planar plate 21, and a second curved segment 72 that is secured in the retaining groove 210' in the top surface 211' of the second planar plate 21 and that is flush with the top surface 211' of the second planar plate 21'.

During assembly, the top surfaces 211, 211' of the first and second planar plates 21, 21' are first disposed on the heat source (not shown). Then, the inlet 23 and the outlet 24 are connected to the pump (not shown) through the pipe (not shown).

During a cooling operation, heat generated by the heat source is conducted through the first and second curved segments 71, 72 of the high thermal-conductivity strip 7, and the first and second planar plates 21, 21' to the first and second finned structures 31, 31'. At the same time, the pump supplies a coolant (not shown) into the first compartment 25 through the inlet 23, and draws the coolant out of the second compartment 26 through the outlet 24. During this operation, the coolant passes through the meandering fluid path and cools the first finned structure 31, thereby permitting efficient dissipation of the heat conducted by the first finned structure 31.

Figure 8:
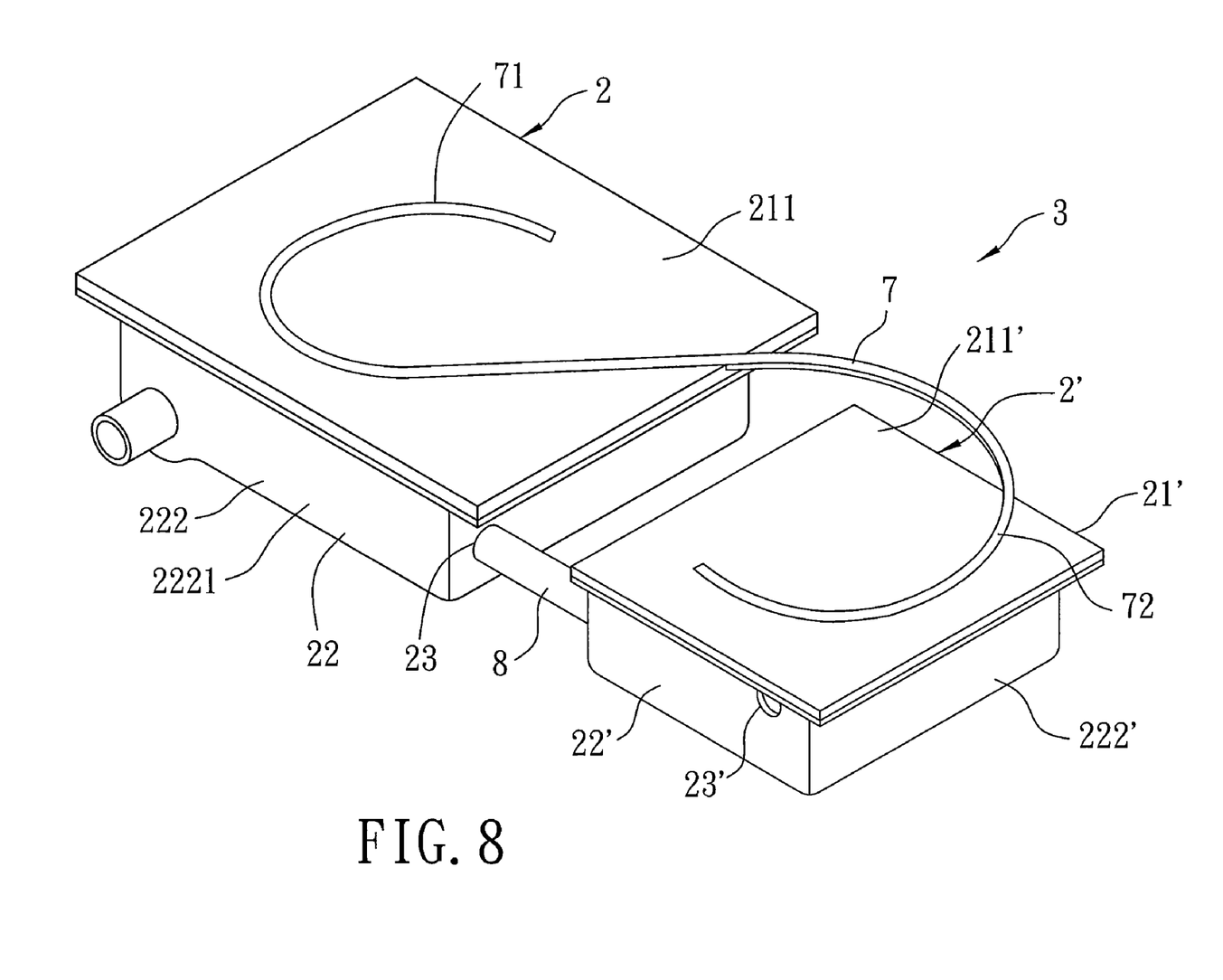
FIG. 8 is a perspective view of the third preferred embodiment of a heat-dissipating device according to this invention.
Figure 9:
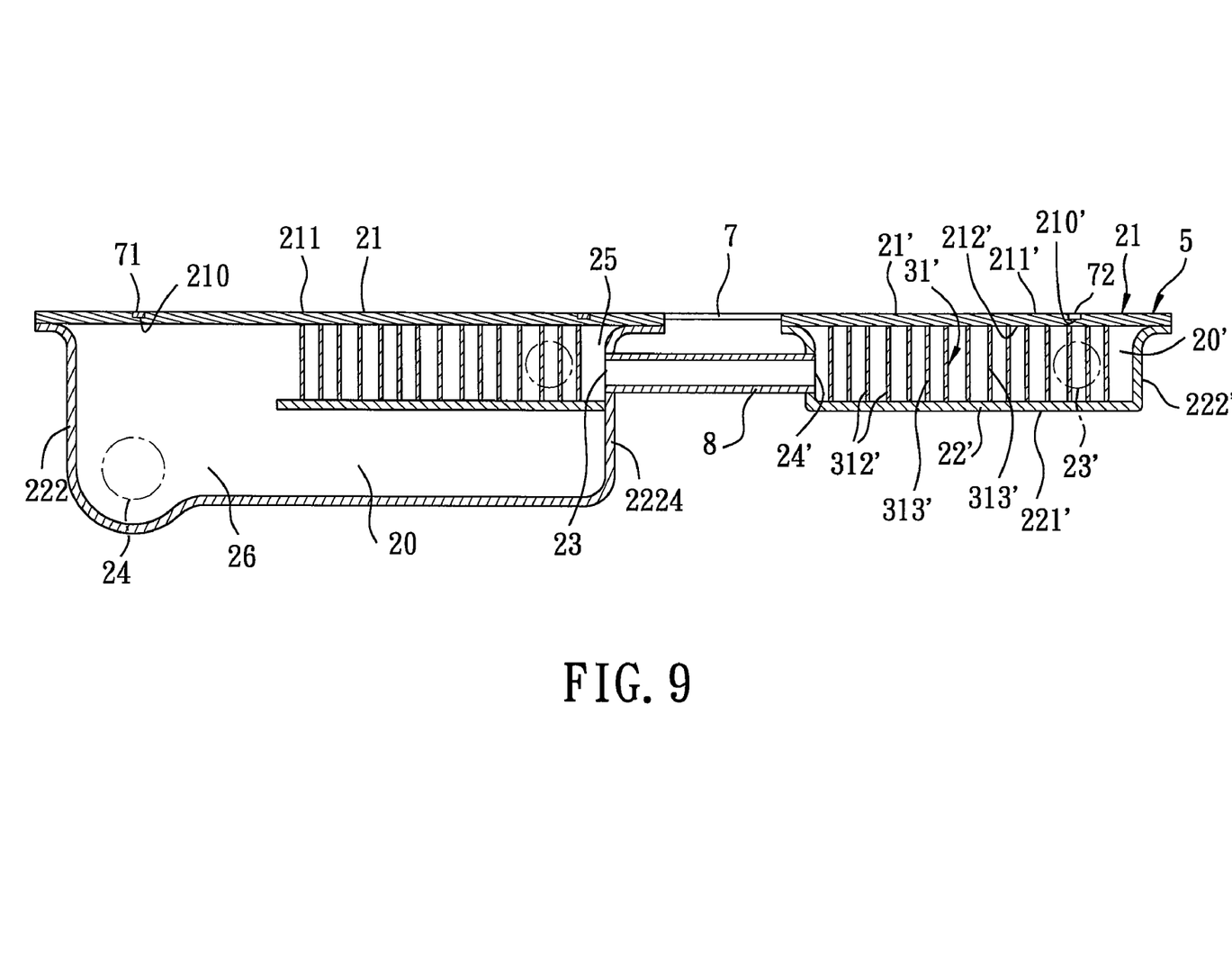
FIG. 9 is a schematic sectional view of the third preferred embodiment.

FIGS. 8 and 9 illustrate the third preferred embodiment of a heat-dissipating device 3 according to this invention. When compared to the first embodiment, the heat-dissipating device 3 of this embodiment further includes a second housing 2', a second finned structure 31', and a connecting pipe 8.

The second housing 2' is spaced apart from the first housing 2, and includes a second planar plate 21' and second cap-like cover 22'. The second planar plate 21' has top and bottom surfaces 211', 212'. In this embodiment, the top surface 211' of the second planar plate 21' is formed with a retaining groove 210'. The second cap-like cover 22' cooperates with second planar plate 21' to define an inner space 20' therebetween. In particular, the second cap-like cover 22' includes a base wall 221' spaced apart from the second planar plate 21', and a surrounding wall 222' that extends transversely from the base wall 221' thereof and that is secured to the bottom surface 212' of the second planar plate 21'. In this embodiment, the surrounding wall 222' of the second cap-like cover 22' has an inlet 23' and an outlet 24'.

The second finned structure 31' includes a plurality of partitioning plates 313' and a plurality of heat-dissipating fins 312'. The partitioning plates 313' of the second finned structure 31' are disposed in the inner space 20' in the second housing 2' so as to divide the inner space 20' in the second housing 2' into a plurality of partitioned sections that are connected to form a continuous meandering fluid path. In this embodiment, the meandering fluid path in the second housing 2' has a first end directly connected to and spatially communicated with the inlet 23' in the surrounding wall 222' of the second cap-like cover 22', and a second end directly connected to and spatially communicated with the outlet 24' in the surrounding wall 222' of the second cap-like cover 22'.

The heat-dissipating fins 312' are disposed in each of the partitioned sections in the second housing 2'.

The high thermal-conductivity strip 7 has a first curved segment 71 that is secured in the retaining groove 210 in the top surface 211 of the first planar plate 21 and that is flush with the top surface 211 of the first planar plate 21, and a second curved segment 72 that is secured in the retaining groove 210' in the top surface 211' of the second planar plate 21' and that is flush with the top surface 211' of the second planar plate 21'.

In this embodiment, the inlet 23 is formed in the right wall portion 2224, instead of the front wall portion 2221, of the surrounding wall 222 of the first cap-like cover 22.

The connecting pipe 8 interconnects the inlet 23 in the right wall portion 2224 of the surrounding wall 222 of the first cap-like cover 22, and the outlet 24' in the surrounding wall 222' of the second cap-like cover 22', thereby permitting fluid communication between the inner spaces 20, 20' in the first and second housings 2, 2'.

During assembly, the top surfaces 211, 211' of the first and second planar plates 21, 21' are first disposed on the heat source (not shown). Then, the inlet 23' in the surrounding wall 222' of the second cap-like cover 22' and the outlet 24 in the front wall portion 2221 of the surrounding wall 222 of the first cap-like cover 22 are connected to the pump (not shown) through the pipe (not shown).

During a cooling operation, heat generated by the heat source is conducted through the first and second curved segments 71, 72 of the high thermal-conductivity strip 7 and the first and second planar plates 21, 21' to the first and second finned structures 31, 31'. At the same time, the pump supplies a coolant (not shown) into the inner space 20' in the second housing 2' through the inlet 23', and draws the coolant out of the second compartment 26 in the first housing 2 through the outlet 24. During this operation, the coolant passes through the meandering fluid path in the second housing 2' and cools the second finned structure 31', and through the meandering fluid path in the first compartment 25 in the first housing 2 and cools the first finned structure 31, thereby permitting efficient dissipation of the heat conducted by the first and second finned structures 31, 31'.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A heat-dissipating device, comprising:
    a first housing including
        a first planar plate that has top and bottom surfaces, said top surface of said first planar plate being formed with a retaining groove, and
        a first cap-like cover that is secured to said bottom surface of said first planar plate, that cooperates with said first planar plate to define an inner space therebetween, and that has an inlet and an outlet;
    a partitioning member disposed in said inner space so as to divide said inner space into first and second compartments, said second compartment being connected to and spatially communicated with said outlet;
    a first finned structure including
        a plurality of partitioning plates disposed in said first compartment so as to divide said first compartment into a plurality of partitioned sections that are connected to form a continuous meandering fluid path for permitting fluid communication between said first and second compartments, said meandering fluid path having a first end connected to and spatially communicated with said inlet, and a second end connected to and spatially communicated with said second compartment, and
        a plurality of heat-dissipating fins disposed in each of said partitioned sections; and
    a high thermal-conductivity strip secured in said retaining groove in said top surface of said first planar plate and having a thermal conductivity higher than that of said first planar plate.

2. The heat-dissipating device as claimed in claim 1, wherein said first cap-like cover includes a base wall spaced apart from said first planar plate, and a surrounding wall that extends transversely from said base wall thereof and that is secured to said bottom surface of said first planar plate,
    said partitioning member extending parallel to said first planar plate, being disposed between and spaced apart from said first planar plate and said base wall of said first cap-like cover, and having an end spaced apart from said surrounding wall of said first cap-like cover.

3. The heat-dissipating device as claimed in claim 2, wherein said first planar plate has a first end portion that cooperates with said partitioning member and a portion of said surrounding wall of said first cap-like cover to define said first compartment, and a second end portion that cooperates with said partitioning member, and said base wall and the remainder of said surrounding wall of said first cap-like cover to define said second compartment.

4. The heat-dissipating device as claimed in claim 3, wherein said high thermal-conductivity strip extends from said first end portion to said second end portion of said first planar plate.

5. The heat-dissipating device as claimed in claim 1, further comprising:
    a heat-dissipating unit spaced apart from said first housing, and including
        a second planar plate having top and bottom surfaces, said top surface of said second planar plate being formed with a retaining groove, and
        a second finned structure including a plurality of heat-dissipating fins formed on said bottom surface of said second planar plate,
    said high thermal-conductivity strip having a first segment that is secured in said retaining groove in said top surface of said first planar plate, and a second segment secured in said retaining groove in said top surface of said second planar plate.

6. The heat-dissipating device as claimed in claim 1, further comprising:
    a second housing spaced apart from said first housing, and including
        a second planar plate that has top and bottom surfaces, said top surface of said second planar plate being formed with a retaining groove, and
        a second cap-like cover that is secured to said bottom surface of said second planar plate, that cooperates with said second planar plate to define an inner space therebetween, and that has an inlet and an outlet;

a second finned structure including
   a plurality of partitioning plates disposed in said inner space in said second housing so as to divide said inner space in said second housing into a plurality of partitioned sections that are connected to form a continuous meandering fluid path, said meandering fluid path in said second housing having a first end connected to and spatially communicated with said inlet in said second cap-like cover, and a second end connected to and spatially communicated with said outlet in said second cap-like cover, and
   a plurality of heat-dissipating fins disposed in each of said partitioned sections in said second housing; and
a connecting pipe interconnecting said inlet in said first cap-like cover and said outlet in said second cap-like cover,
said high thermal-conductivity strip having a first segment secured in said retaining groove in said top surface of said first planar plate, and a second segment secured in said retaining groove in said top surface of said second planar plate.

* * * * *